(12) United States Patent
Pietraszkiewicz et al.

(10) Patent No.: US 7,422,771 B2
(45) Date of Patent: Sep. 9, 2008

(54) METHODS FOR APPLYING A HYBRID THERMAL BARRIER COATING

(75) Inventors: Edward F. Pietraszkiewicz, Southington, CT (US); Kevin W. Schlichting, Storrs, CT (US); David A. Litton, Rocky Hill, CT (US); Heather A. Terry, Middletown, CT (US)

(73) Assignee: United Technologies Corporation, Hartford, CT (US)

( * ) Notice: Subject to any disclaimer, the term of this patent is extended or adjusted under 35 U.S.C. 154(b) by 0 days.

(21) Appl. No.: 11/219,157

(22) Filed: Sep. 1, 2005

(65) Prior Publication Data

US 2007/0048534 A1   Mar. 1, 2007

(51) Int. Cl.
   *B05D 1/32* (2006.01)
(52) U.S. Cl. ............... 427/255.7; 427/282; 427/287; 427/596; 427/255.32
(58) Field of Classification Search .......... 427/282, 427/287, 596, 255.32, 255.7
See application file for complete search history.

(56) References Cited

U.S. PATENT DOCUMENTS

| 4,321,311 | A | | 3/1982 | Strangman |
|---|---|---|---|---|
| 4,405,659 | A | | 9/1983 | Strangman |
| 4,405,660 | A | | 9/1983 | Ulion et al. |
| RE32,121 | E | | 4/1986 | Gupta et al. |
| 4,585,481 | A | | 4/1986 | Gupta et al. |
| 4,861,618 | A | | 8/1989 | Vine et al. |
| 5,087,477 | A | | 2/1992 | Giggins, Jr. et al. |
| RE33,876 | E | | 4/1992 | Goward et al. |
| 5,209,645 | A | | 5/1993 | Kojima et al. |
| 5,262,245 | A | | 11/1993 | Ulion et al. |
| 5,514,482 | A | * | 5/1996 | Strangman .......... 428/623 |
| 5,723,078 | A | * | 3/1998 | Nagaraj et al. .......... 264/36.18 |
| 5,861,902 | A | * | 1/1999 | Beerling .......... 347/63 |
| 5,876,860 | A | * | 3/1999 | Marijnissen et al. .......... 428/623 |
| 5,902,647 | A | * | 5/1999 | Venkataramani et al. .... 427/454 |
| 6,234,755 | B1 | * | 5/2001 | Bunker et al. .......... 416/97 R |
| 6,365,236 | B1 | * | 4/2002 | Maloney .......... 427/585 |
| 6,413,584 | B1 | * | 7/2002 | Wustman et al. .......... 427/250 |
| 6,528,118 | B2 | * | 3/2003 | Lee et al. .......... 427/258 |
| 6,599,568 | B2 | * | 7/2003 | Lee et al. .......... 427/230 |

(Continued)

FOREIGN PATENT DOCUMENTS

EP    1508628 A    2/2005

(Continued)

OTHER PUBLICATIONS

Ukraine Office Action for Ukraine Patent Application No. 2006 07046.

(Continued)

*Primary Examiner*—Bret Chen
(74) *Attorney, Agent, or Firm*—Bachman & LaPointe, P.C.

(57) ABSTRACT

A method for applying a hybrid thermal barrier coating, comprising masking at least a portion of a first surface of a component with a first maskant; applying a first coating material to at least a portion of a second surface of said component; removing said first maskant; optionally masking at least a portion of said second surface of said component with a second maskant; applying a second coating material to at least a portion of said first surface of said component; and removing said second maskant.

19 Claims, 1 Drawing Sheet

U.S. PATENT DOCUMENTS

| | | | |
|---|---|---|---|
| 6,720,038 B2 * | 4/2004 | Darolia et al. | 427/596 |
| 6,730,422 B2 | 5/2004 | Litton et al. | |
| 6,733,907 B2 * | 5/2004 | Morrison et al. | 428/699 |
| 6,863,937 B2 * | 3/2005 | Bruce et al. | 427/566 |
| 2004/0134066 A1 | 7/2004 | Hawtin | |

FOREIGN PATENT DOCUMENTS

| | | | |
|---|---|---|---|
| EP | 1536039 A | 6/2005 | |
| EP | 1647611 A | 4/2006 | |
| WO | WO-02092872 A | 11/2002 | |

OTHER PUBLICATIONS

European Search Report, Jan. 24, 2008.

* cited by examiner

METHODS FOR APPLYING A HYBRID THERMAL BARRIER COATING

BACKGROUND OF THE INVENTION (1) Field of the Invention

This inventions relates to methods for applying thermal barrier coatings and, more particularly, to methods for applying a hybrid thermal barrier coating.

(2) Description of the Related Art

Gas turbine engines are well developed mechanisms for converting chemical potential energy, in the form of fuel, to thermal energy and then to mechanical energy for use in propelling aircraft, generating electrical power, pumping fluids, etc. At this time, the major available avenue for improved efficiency of gas turbine engines appears to be the use of higher operating temperatures. However, the metallic materials used in gas turbine engines components are currently very near the upper limits of their thermal stability. In the hottest portion of modern gas turbine engines, metallic materials are used at gas temperatures above their melting points. They survive because they are air cooled. But providing air cooling reduces engine efficiency.

Accordingly, there has been extensive development of thermal barrier coatings for use with cooled gas turbine aircraft hardware. By using a thermal barrier coating, the amount of cooling air required can be substantially reduced, thus providing a corresponding increase in efficiency.

Turbine blades and vanes are two exemplary cooled gas turbine aircraft components utilizing thermal barrier coatings. Turbine blades and vanes in the hot section of the cooled gas turbine are typically coated with a metallic and/or ceramic thermal barrier coating to increase their durability. Ceramic thermal barrier coatings are applied anywhere from 0.5 to 10 mils or more and can reduce temperatures at the surface of the metal substrate by up to 300° F. or more. For typical current thermal barrier coating systems, the ceramic material is applied by either a plasma-spray, typically in air (APS) process, or a physical vapor deposition process, such as electron beam physical deposition (EB-PVD).

A typical distress mode, exhibited by blades and vanes during their part life, is an oxidation prone hot spot developing on the pressure side of the airfoil. Presently, these hot spots may be coated with a low thermal conductivity thermal barrier coating, e.g., which exhibit a thermal conductivity value that is 50% to 60% lower than current commercially available thermal barrier coatings such as 7YSZ. However, as blades and vanes experience severe operating conditions at high mach numbers, another distress mode exhibited in high mach number regions of the airfoil is particulate erosion, e.g., of the coating and in cases the underlying substrate.

Consequently, there exists a need for a thermal barrier coating which provides the requisite thermal conductivity necessary to prevent oxidation yet also exhibits erosion resistant properties to withstand particulate erosion.

SUMMARY OF THE INVENTION

In accordance with the present invention, a method for applying a hybrid thermal barrier coating broadly comprises masking at least a portion of a first surface of a component with a first maskant; applying a first coating material to at least a portion of a second surface of the component; removing the first maskant; optionally masking at least a portion of the second surface of the component with a second maskant; applying a second coating material to at least a portion of the first surface of the component; and removing the second maskant.

A method for applying a hybrid thermal barrier coating broadly comprises applying a first thermal barrier coating material having a first thermal conductivity value to at least a portion of a first surface of a component; and applying a second thermal barrier coating material having a second thermal conductivity value to at least a portion of a second surface of the component and optionally at least a portion of the first surface, wherein the second thermal conductivity value is greater than or less than the first thermal conductivity value.

An article broadly comprises an exterior surface; a first coating having a first thermal conductivity value disposed upon at least a first portion of said exterior surface; and a second coating having a second thermal conductivity value disposed upon at least a second portion of the exterior surface and optionally the first portion broadly comprising the first coating.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

Like reference numbers and designations in the various drawings indicate like elements.

DETAILED DESCRIPTION

Figure 1:
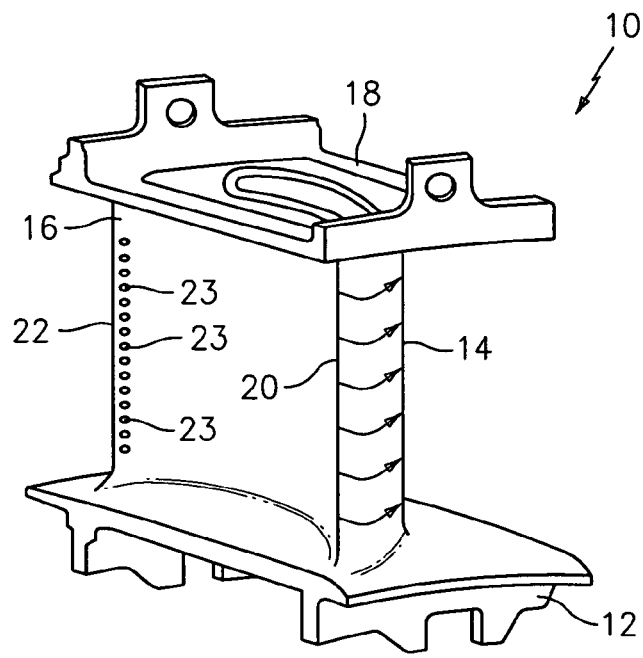
FIG. 1 is a representation of a component for use in a gas turbine engine.

The method(s) described herein for applying thermal barrier coatings address both the need for gas turbine engine components to withstand oxidation and particulate erosion. The method(s) of the present invention apply a combination of a low thermal conductivity thermal barrier coating and a high thermal conductivity thermal barrier coating; each in an amount sufficient to prevent oxidation and withstand particulate erosion.

Generally, an article, having particular utility as a component in a gas turbine engine, may be provided in accordance with the present invention. The article may have a metal substrate and any one of a number of low and high thermal conductivity thermal barrier coatings known in the art applied to the substrate. These low and high thermal conductivity thermal barrier coatings may be applied using any one of a number of methods known to one of ordinary skill in the art and, preferably for higher temperature applications, may be applied using physical vapor deposition and plasma spray processes.

Representative low thermal conductivity thermal barrier coatings contemplated for use in both physical vapor deposition and plasma spraying processes include, but are not limited to, the entire low thermal conductivity thermal barrier coatings described in U.S. Pat. No. 6,730,422 to Litton, et al., assigned to United Technologies Corporation, and incorporated by reference herein in its entirety. It is contemplated that the low thermal conductivity thermal barrier coatings possess a thermal conductivity value having a range of about 1 btu in/hr ft$^2$° F. (0.145 W/mK) to 10 btu in/hr ft$^2$° F. (1.45 W/mK).

Representative high thermal conductivity thermal barrier coatings contemplated for use in air plasma spray processes include, but are not limited to, the high thermal conductivity thermal barrier coatings described in, for example, U.S. Pat. No. 4,861,618 to Vine et al., assigned to United Technologies Corporation, and incorporated by reference herein in its entirety. It is contemplated that the high thermal conductivity thermal barrier coatings possess a thermal conductivity value having a range of about 5 btu in/hr ft$^{2\circ}$ F. (0.72 W/mK) to 17 btu in/hr ft$^{2\circ}$ F. (2.45 W/mK).

Representative high thermal conductivity thermal barrier coatings contemplated for use in the electron beam physical vapor deposition process include, but are not limited to, the entire high thermal conductivity thermal barrier coatings described in the following patents, all assigned to United Technologies Corporation and incorporated by reference herein in their entirety: U.S. Pat. No. 4,405,660 to Ulion et al.; U.S. Pat. No. 4,585,481 to Gupta, et al.; U.S. Pat. No. 5,087, 477 to Giggins, Jr., et al.; U.S. Pat. No. 4,321,311 to Strangman; and, U.S. Pat. No. 5,262,245 to Ulion et al. The high thermal conductivity thermal barrier coatings may exhibit various microstructures dependent upon the desired characteristics, for example, preventing oxidation, erosion resistance, and the like. High thermal conductivity thermal barrier coatings may exhibit a single crystal microstructure as described in U.S. Pat. No. 4,719,080 to Duhl et al., assigned to United Technologies Corporation and incorporated by reference herein in its entirety, or a columnar grain as described in, for example, Strangman et al. and Ulion et al., or equiaxial structures too.

The high and low thermal barrier coatings may be applied directly to a surface of the substrate or may be applied to a bond coat deposited on one or more surfaces of the substrate. Preferably, both the high and low thermal conductivity thermal barrier coatings are applied either directly to the surface of the substrate or to the deposited bond coat using physical vapor deposition or air plasma spray process. The substrate may comprise a nickel based superalloy, a cobalt based superalloy, a ferrous alloy such as steel, a titanium alloy, a copper alloy and combinations thereof.

The bond coat may comprise any suitable bond coat known in the art. For example, the bond coat may be formed from an aluminum containing material, an aluminide, a platinum aluminide, a ceramic material, such as 7 wt % yttria stabilized zirconia, or an MCrAlY material, which are well known in the art. Preferably, the bond coat is formed using low pressure plasma spray. If desired, the bond coat may have an oxide scale on an outer surface prior to depositing the thermal barrier compositions; the oxide scale typically comprises alumina. The oxide scale promotes the adherence of the low and/or high thermal conductivity thermal barrier coatings to the bond coat.

In some embodiments, the article may have the aforementioned oxide scale on its surface and one or more of the high or low thermal barrier coatings may be applied directly over and bonded to the oxide scale using any suitable deposition technique known in the art including, but not limited to, diffusion processes, physical vapor deposition, and/or chemical vapor deposition techniques. Preferably, the high and low thermal conductivity thermal barrier coatings are applied over and bonded to the oxide scale, if present, using physical vapor deposition or plasma spray process.

Although many deposition methods known to one of ordinary skill in the art may be contemplated and used, electron beam physical vapor deposition and air plasma spraying are preferred to apply the low and high thermal conductivity thermal barrier coatings of the methods described herein. The electron beam physical vapor deposition process used herein is described, for example, in the '477 patent to Giggins, Jr., et al. while the air plasma spray process used herein is described, for example, in the '618 patent to Vine et al.

Referring now to FIG. 1, the electron beam physical vapor deposition ("EB-PVD") process generally comprises placing and suspending a component (shown) to be coated into a coating chamber of a conventional EB-PVD apparatus (not shown). Optionally, the aforementioned bond coat comprising the bond coat materials described herein may be deposited upon platforms 12, 18 and suction side 14 using the EB-PVD process. Optionally as well, the aforementioned alumina oxide scale may be formed by oxidizing the surface of the bond coat. For purposes of illustration and not to be taken in a limiting sense, the component of a gas turbine engine may be a vane or a blade. A vane 10 comprises a bottom platform 12, an airfoil having a suction side 14, a pressure side 16, and a top platform 18, wherein suction side 14 and pressure side 16 have a leading edge 20 and a trailing edge 22 that as a whole define an airfoil of vane 10. Conventional blades and vanes also include a plurality of cooling holes 23 along their trailing edges.

Once the optional bond coat and alumina oxide scale are deposited upon the component, one or more maskants or masking agents may be applied to one or more portions of the component in order to apply upon the component one or more thermal barrier coatings comprising varying thermal conductivity values. A first maskant 24 may comprise any type of material that substantially covers and/or completely covers the surface of the part to be coated and can withstand the conditions of the coating process. Suitable materials for first maskant 24 include, but are not limited to, a metal sheet, e.g., an aluminum sheet, aluminum tape, aluminum foil, nickel alloy sheet, combinations comprising at least one of the foregoing, and the like, and preferably aluminum foil due to its low cost, resiliency and effectiveness.

For purposes of illustration and not to be taken in a limiting sense, the first maskant 24 may comprise a sheet 26 of material having a plurality of protuberances 28 extending from a surface of sheet 26 proximate to a first edge 30. In this example, first maskant 24 may be placed onto pressure side 16 such that protuberances 28 are inserted within the cooling holes of vane 10 to secure first maskant 24 to vane 10. It is contemplated as can be recognized by one of ordinary skill in the art that first maskant 24 may generally be constructed to fit a variety of components of a gas turbine engine and is not limited to a vane. Once first maskant 24 is applied, vane 10 may be prepared to receive a low or high thermal conductivity thermal barrier coating as is known to one of ordinary skill in the art. Preferably, a higher thermal conductivity thermal barrier coating material comprising any one of the aforementioned coating materials described herein and combinations thereof may be deposited upon the optional bond coat or the surface of platforms 12, 18 and suction side 14 using the EB-PVD process as known to one of ordinary skill in the art. Once the high thermal conductivity thermal barrier coating deposition is completed, first maskant 24 may be removed.

Figure 3:
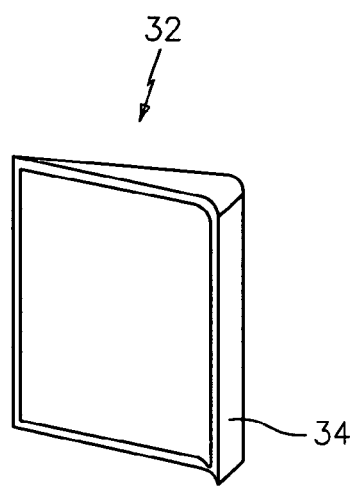
FIG. 3 is a representation of a second maskant of the present invention.

A second maskant 32 may then be applied to vane 10. Second maskant 32 may comprise a cover 34 as represented in FIG. 3. In FIG. 3, second maskant 32 possesses a shape substantially conforming to suction side 14 and platforms 12, 18 of said vane, such that platforms 12, 18 fit within cover 34, and permitting exposure of pressure side 16. It is contemplated as recognized by one skilled in the art that cover 34 may be constructed to fit a variety of components of a gas turbine engine and is not limited to a vane. Second maskant 24 may be constructed from any materials suitable to withstand the operating environment and conditions of the contemplated deposition process, e.g., EB-PVD processes. Suitable materials for cover 34 include, but are not limited to, aluminum sheet, aluminum tape, nickel alloy sheet, combinations comprising at least one of the foregoing, and the like. For example, when employing an EB-PVD process, cover 34 may comprise a nickel alloy sheet metal such as Inconel 625 (IN625®) which can withstand the process operating conditions. Once the bond coat and optional alumina oxide scale are deposited and second maskant 34 applied, vane 10 may be prepared to receive a low or high thermal conductivity thermal barrier coating as is known to one of ordinary skill in the art. Preferably, a lower thermal conductivity thermal barrier coating material comprising any one of the aforementioned ceramic coating materials described herein and combinations thereof may be deposited upon the optional bond coat or directly upon the surface of pressure side 16 using the EB-PVD process as known to one of ordinary skill in the art. Once the high thermal conductivity thermal barrier coating deposition is completed, second maskant 34 may be removed.

In the alternative, a second maskant may be optional when applying the low and high thermal conductivity thermal barrier coatings using the electron beam physical vapor deposition process described herein. Rather than applying a second maskant or masking agent as described herein, the aforementioned low thermal conductivity thermal barrier coating may be deposited upon the intended area including the portion coated with the high thermal conductivity thermal barrier coating. Once the first maskant or masking agent has been removed, the aforementioned low thermal conductivity thermal barrier coating may then be applied to the entirety of the component and overlap at least a portion coated with the high thermal conductivity thermal barrier coating. It is also contemplated that the low thermal barrier coating could be applied first, and then a higher thermal conductivity thermal barrier coating may be applied without using a second maskant or masking agent.

Figure 2:
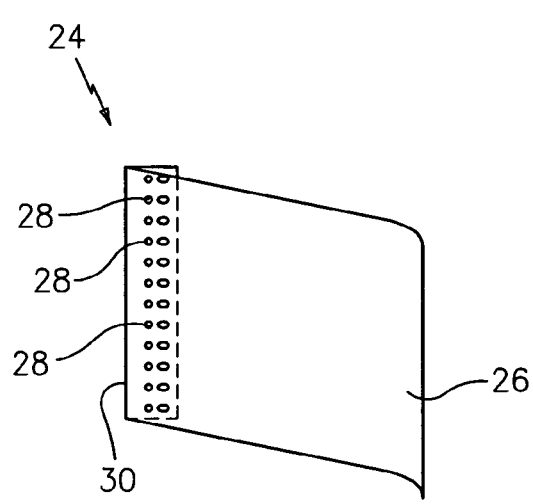
FIG. 2 is a representation of a first maskant of the present invention.

For ease in describing another method of the present invention, the combined low pressure plasma spray/air plasma spray method will also be described using FIGS. 1-3. A conventional low pressure plasma spray method for use herein is described in the '481 patent to Gupta et al., while a conventional air plasma spray method for use herein is described in the '618 patent to Vine et al. The optional bond coat applied to the entire vane or blade may preferably be applied using the low pressure plasma spray method. The low and high thermal conductivity thermal barrier coatings may be applied using the air plasma spray method.

When employing the air plasma spraying process, a maskant and/or a masking agent is not required. One skilled in the art will recognize that a plasma spray may be relatively finely tuned to deposit a first coating material upon the component and then a second coating material upon the component without requiring a maskant or masking agent. As understood by one of ordinary skill in the art, a certain amount of the second coating material may be deposited upon and overlap the first coating material. The area containing both coating materials may be recognized as an overspray area or a coating transition zone where the first coating material and second coating material overlap and/or taper together.

When carrying out the method contemplated herein, vane 10 may be prepared to receive an optional bond coat material using a conventional air plasma spraying process as understood by one of ordinary skill in the art. The optional bond coat material is preferably one of the aforementioned bond coat materials described herein and combinations thereof. The bond coat material may be deposited upon to at least a portion of a first surface of vane 10 such as suction side 14 and platforms 12, 18. Preferably, the bond coat material is deposited upon the entirety of the first surface of vane 10. Optionally, the aforementioned alumina oxide scale may be formed by oxidizing the surface of the bond coat. Preferably, a higher thermal conductivity thermal barrier coating is applied to suction side 14. Once the bond coat is deposited, vane 10 may be prepared to receive one of the aforementioned low or high thermal conductivity thermal barrier coatings described herein. The low or high thermal conductivity thermal barrier coating material may be deposited upon the optional bond coat or the surface of platforms 12, 18 and suction side 14 using the air plasma spray process as known to one of ordinary skill in the art. Once the first thermal conductivity thermal barrier coating deposition is completed, vane 10 may be prepared to receive a second thermal conductivity thermal barrier coating.

An optional bond coat comprising any one of the aforementioned bond coat materials described herein and combinations thereof may be deposited upon pressure side 16 using an EB-PVD process as known to one of ordinary skill in the art. Optionally, the aforementioned alumina oxide scale may be formed by oxidizing the surface of the bond coat. Once the optional bond coat is deposited, vane 10 may be prepared to receive one of the aforementioned low or high thermal conductivity thermal barrier coatings described herein as the second thermal conductivity thermal barrier coating. The second thermal conductivity thermal barrier coating will be different than the first thermal conductivity thermal barrier coating, that is, a low thermal conductivity thermal barrier coating is used rather than a high thermal conductivity thermal barrier coating, and vice versa. The second thermal conductivity thermal barrier coating may be deposited upon the optional bond coat or the surface of pressure side 16 using the EB-PVD process as known to one of ordinary skill in the art.

The resultant coated articles made by the methods described herein provide distinct advantages over the prior art. In the past, the coated articles, e.g., vanes and blades, were simply coated with a low thermal conductivity thermal barrier coating without regard to whether coating the entire vane or blade was necessary. Such decisions were not cost effective and ultimately expended more materials than necessary. In applying the method(s) described herein, the coated articles now possess low thermal conductivity thermal barrier coatings where necessary, that is, areas experiencing high heat loads such as the pressure side and leading edge of a vane or blade, rather than the entire part. As a result, expensive low thermal conductivity thermal barrier coating materials are reserved, while highly effective and less expensive high thermal conductivity thermal barrier coatings are employed and applied to areas experiencing low heat loads such as the suction side of the vane or blade.

In employing the present method(s), high thermal conductivity thermal barrier coatings may be applied to the suction side of the coated article, e.g., vane or blade, where particulate erosion tends to be part life limiting, while low thermal conductivity thermal barrier coatings may be applied to the pressure side, where hotspots tend to be part life limiting. High thermal conductivity thermal barrier coatings having a thermal conductivity value within the range provided herein also exhibit effective erosion resistance.

The hybrid thermal barrier coating scheme described herein can be utilized most effectively when overlapping such high and low thermal conductivity thermal barrier coatings. For example, if an overlap region of an article to be coated is identified as a high erosion area, a high thermal conductivity thermal barrier coating may be applied first and the low thermal conductivity barrier coating may be applied to overlap. If, on the other hand, the overlap region of the article to be coated is identified as a hotspot, a low thermal conductivity thermal barrier coating may be applied first and the high thermal conductivity thermal barrier coating may be applied to overlap.

It is to be understood that the invention is not limited to the illustrations described and shown herein, which are deemed to be merely illustrative of the best modes of carrying out the invention, and which are susceptible to modification of form, size, arrangement of parts, and details of operation. The invention rather is intended to encompass all such modifications which are within its spirit and scope as defined by the claims.

What is claimed is:

1. A method for applying a hybrid thermal barrier coating, comprising:
   applying a metallic sheet having one or more protrusions to at least a portion of a first surface of a component; and
   inserting said one or more protrusion into one or more apertures along an edge on said first surface;
   applying a first coating material having a first thermal conductivity value to at least a portion of a second surface of said component;
   removing said metallic sheet; and
   applying a second coating material having a second thermal conductivity value to at least a portion of said first surface of said component,
   wherein said first thermal conductivity value is greater or less than said second thermal conductivity value.

2. The method of claim 1, wherein applying said first coating material and said second coating material comprises using a physical vapor deposition process.

3. The method of claim 2, wherein applying said first coating material and said second coating material comprises using an electron beam physical vapor deposition process.

4. The method of claim 1, wherein said second coating material comprises a thermal barrier coating having a thermal conductivity value of about 1 btu in/hr ft$^2$ ° F. (0.145 W/mK) to 10 btu in/hr ft$^2$ ° F. (1.45 W/mK).

5. The method of claim 1, wherein said first coating material comprises a thermal barrier coating having a thermal conductivity value of about 5 btu in/hr ft$^2$ ° F. (0.72 W/mK) to 17 btu in/hr ft$^2$ ° F. (2.45 W/mK).

6. The method of claim 1, wherein said first thermal conductivity value is greater than a second thermal conductivity value.

7. The method of claim 1, wherein said second thermal conductivity value is greater than a first thermal conductivity value.

8. The method of claim 1, wherein said second coating material overlaps at least a portion of said first coating material.

9. The method of claim 1, further comprising applying a bond coat to said second surface of said component prior to applying said first coating material.

10. The method of claim 1, further comprising applying a bond coat to said first surface of said component prior to applying said second coating material.

11. The method of claim 1, wherein said component is a vane or a blade, said first surface is a pressure side and said second surface comprises a suction side and a platform.

12. The method of claim 1, further comprising optionally masking at least a portion of said second surface of said component with a second maskant prior to applying said second coating material; and removing said optional second maskant after applying said second coating material.

13. The method of claim 12, wherein optionally masking at least said portion of said second surface comprises applying a mask having a shape substantially conforming to a negative of said second surface of said component and permitting exposure of said first surface.

14. The method of claim 13, wherein said mask comprises any one of the following materials: aluminum sheet, aluminum tape, nickel alloy sheet and combinations thereof.

15. The method of claim 1, wherein said component comprises any one of the following materials: nickel based superalloy, cobalt based superalloy, ferrous based superalloy, titanium alloy, copper alloy and combinations thereof.

16. The method of claim 1, wherein said metallic sheet comprises any one of the following materials: aluminum sheet, aluminum tape, aluminum foil, nickel alloy sheet and combinations thereof.

17. The method of claim 1, wherein said second coating material tapers together with at least a portion of said first coating material.

18. The method of claim 1, wherein said second thermal barrier coating material overlaps at least a portion of said first thermal barrier coating material.

19. The method of claim 1, further comprising forming a coating transition zone comprising said first coating material and said second coating material on at least a portion of said first surface or at least a portion of said second surface or both of said component.

* * * * *

UNITED STATES PATENT AND TRADEMARK OFFICE
CERTIFICATE OF CORRECTION

PATENT NO. : 7,422,771 B2 Page 1 of 1
APPLICATION NO. : 11/219157
DATED : September 9, 2008
INVENTOR(S) : Edward F. Pietraszkiewicz et al.

It is certified that error appears in the above-identified patent and that said Letters Patent is hereby corrected as shown below:

In column 7, claim 1, line 21, delete "protrusion" and insert --protrusions--.

In column 7, claim 6, line 47, delete "a" and insert --said--.

In column 8, claim 7, line 2, delete "a" and insert --said--.

Signed and Sealed this

Ninth Day of December, 2008

JON W. DUDAS
*Director of the United States Patent and Trademark Office*